United States Patent
Koposov et al.

(10) Patent No.: US 9,614,169 B2
(45) Date of Patent: Apr. 4, 2017

(54) BACK CONTACT PEROVSKITE SOLAR CELL

(71) Applicant: Sharp Laboratories of America, Inc., Camas, WA (US)

(72) Inventors: Alexey Koposov, Vancouver, WA (US); Wei Pan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 309 days.

(21) Appl. No.: 14/482,450

(22) Filed: Sep. 10, 2014

(65) Prior Publication Data
US 2015/0380667 A1    Dec. 31, 2015

Related U.S. Application Data

(63) Continuation-in-part of application No. 14/320,702, filed on Jul. 1, 2014, and a continuation-in-part of
(Continued)

(51) Int. Cl.
*H01M 8/10*    (2016.01)
*H01L 51/42*    (2006.01)
(Continued)

(52) U.S. Cl.
CPC ...... *H01L 51/4213* (2013.01); *H01L 51/4233* (2013.01); *H01L 51/441* (2013.01); *H01L 51/0017* (2013.01); *Y02E 10/549* (2013.01)

(58) Field of Classification Search
CPC .............. H01L 51/4213; H01L 51/441; H01L 51/4233; H01L 51/0017
See application file for complete search history.

(56) References Cited

U.S. PATENT DOCUMENTS

2015/0144196 A1*  5/2015  Irwin ............... H01G 9/2027
                                                                 136/261

OTHER PUBLICATIONS

"Hole Selective MoOx Contact for Silicon Solar Cells", Nano Lett., ASAP, dx.doi.org/10.1021/nl404389u.
(Continued)

*Primary Examiner* — Jane Rhee
(74) *Attorney, Agent, or Firm* — Law Office of Gerald Maliszewski; Gerald Maliszewski

(57) ABSTRACT

A method is provided for forming a back contact perovskite solar cell. A substrate is coated with a positive electrode layer. The positive electrode layer is then conformally coated with a first insulator. A plurality of negative electrode segments are selectively deposited overlying the first insulator layer, and a second insulator layer is conformally deposited overlying the negative electrode segments and first insulator layer. The second insulator layer is selectively etched to expose the negative electrode segments, and an n-type semiconductor is selectively deposited overlying each exposed negative electrode segment to form n-type contacts. The first and second insulator layers are then selectively etched to expose positive electrode segments. A p-type semiconductor is selectively deposited over each exposed positive electrode segment to form p-type contacts. Finally, a hybrid organic/inorganic perovskite (e.g., $CH_3NH_3PbI_{3-x}Cl_x$) layer is conformally deposited overlying the p-type and n-type contacts. A back contact solar cell is also provided.

16 Claims, 5 Drawing Sheets

Related U.S. Application Data application No. 14/320,691, filed on Jul. 1, 2014, which is a continuation-in-part of application No. 14/320,488, filed on Jun. 30, 2014.

(51) Int. Cl.
*H01L 51/44* (2006.01)
*H01L 51/00* (2006.01)

(56) References Cited

OTHER PUBLICATIONS

"Perovskite solar cells with a planar heterojunction structure prepared using room-temperature solution . . . " Nature Photonics | vol. 8 | Feb. 2014, 10.1038/NPHOTON.2013.342.
"Efficient planar heterojunction perovskite solar cells by vapour deposition" Sep. 19, 2013 | vol. 501 | NATURE | 395.

\* cited by examiner

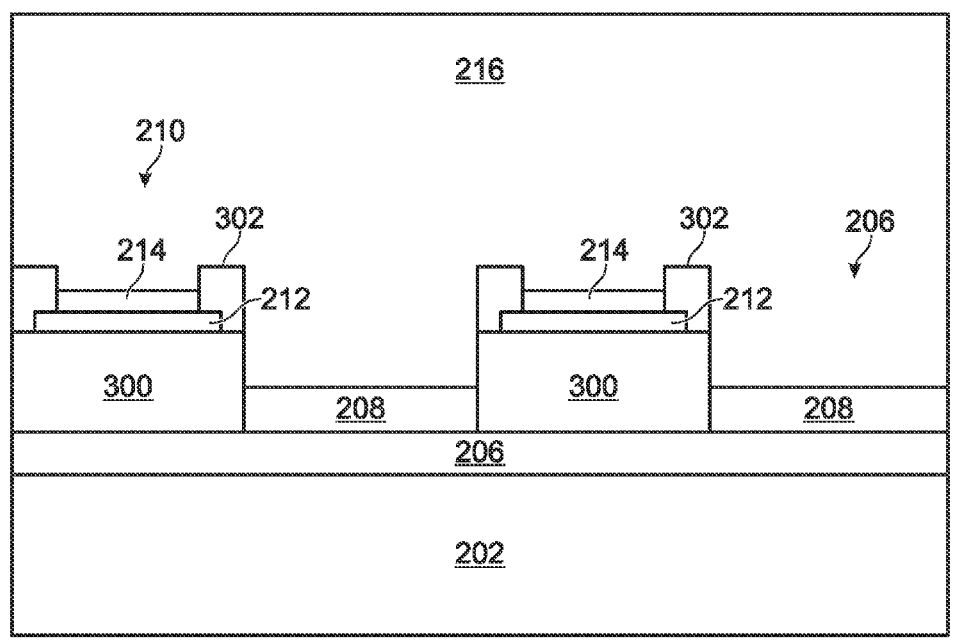
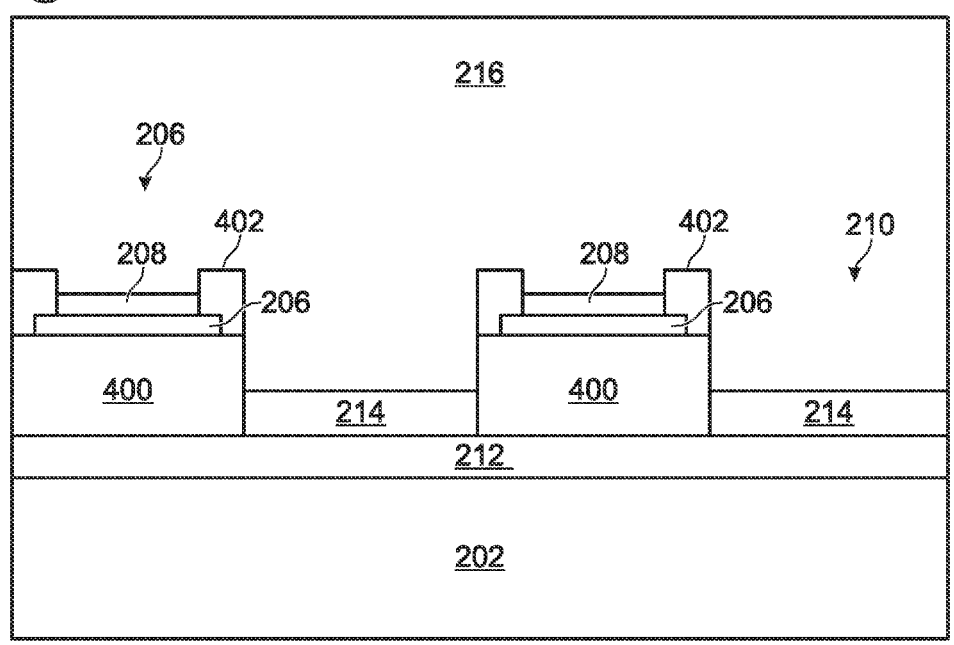

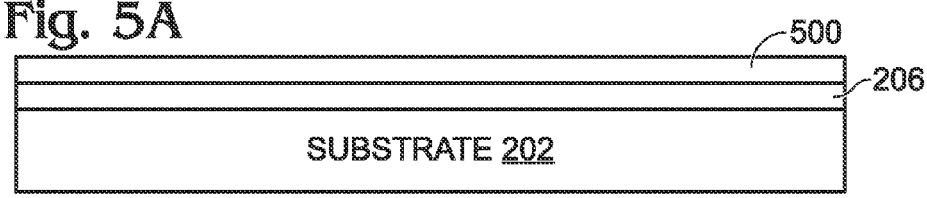
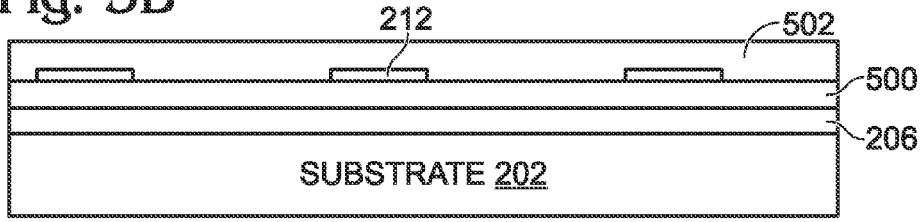
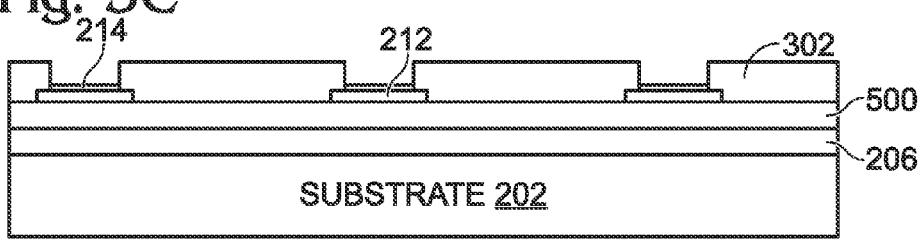
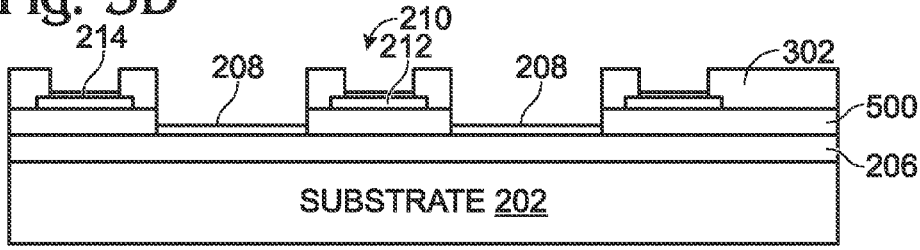
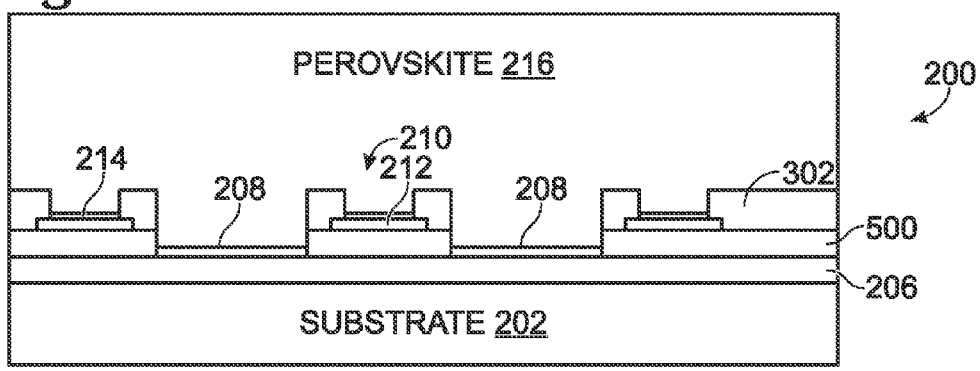

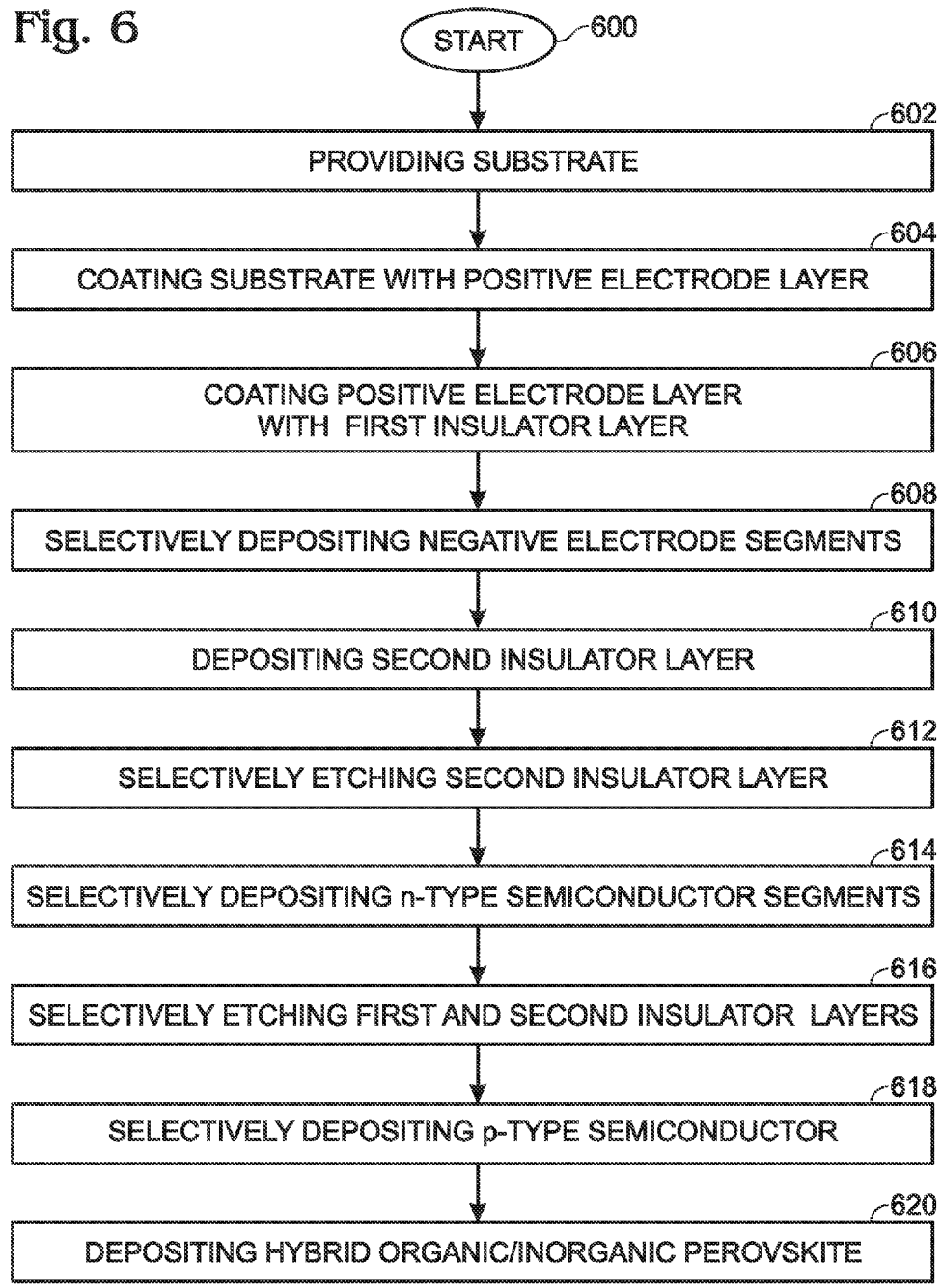

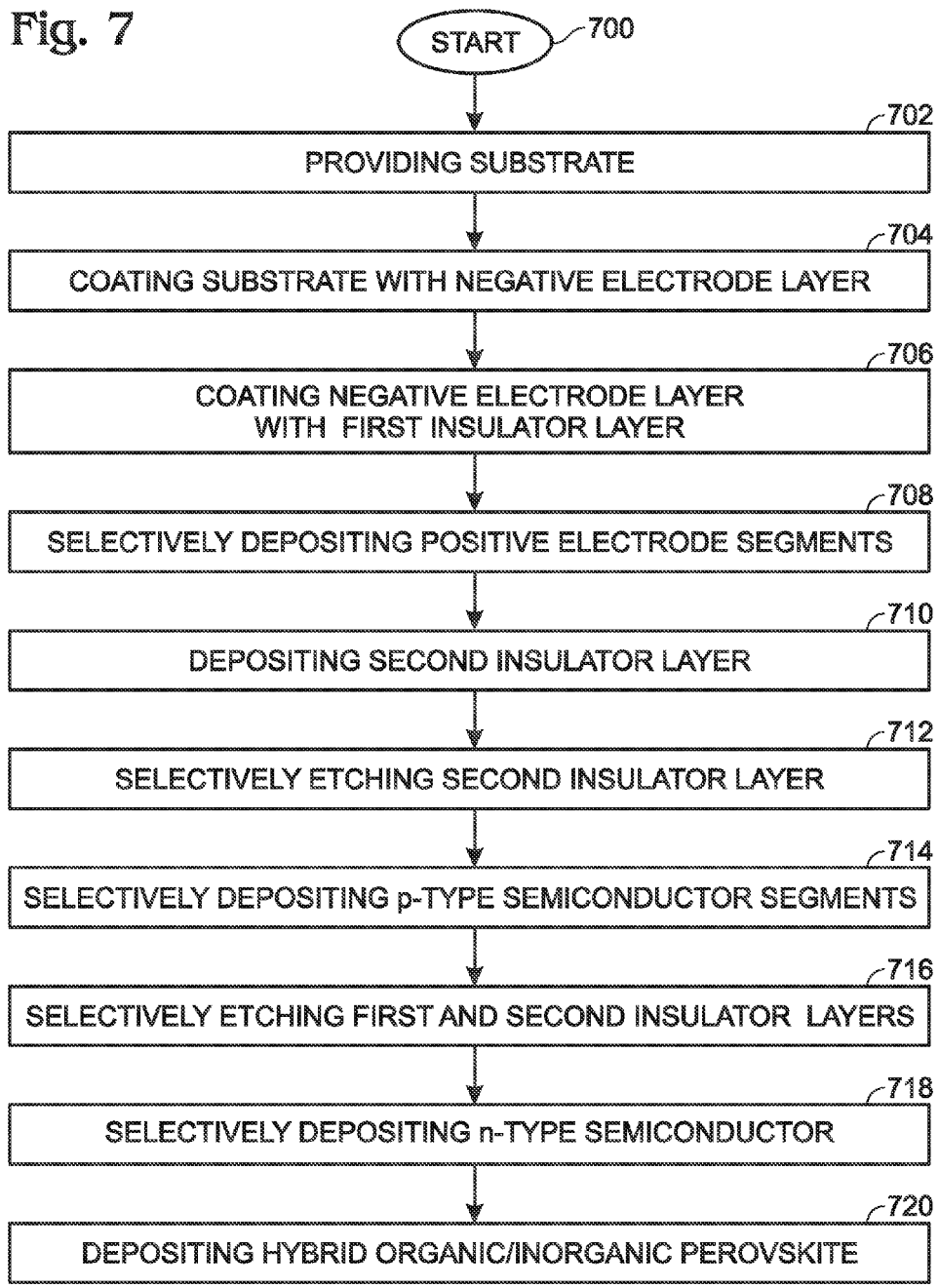

BACK CONTACT PEROVSKITE SOLAR CELL

RELATED APPLICATIONS

This application is a Continuation-in-part of a patent application entitled, MESOPOROUS STRUCTURE SOLAR CELL WITH SILOXANE BARRIER, invented by Alexey Koposov et al., Ser. No. 14/320,702, filed Jul. 1, 2014;

This application is a Continuation-in-part of a parent application entitled, PLANAR STRUCTURE SOLAR CELL WITH INORGANIC HOLE TRANSPORTING MATERIAL, invented by Alexey Koposov et al., Ser. No. 14/320,691, filed Jul. 1, 2014.

Which is a Continuation-in-part of a patent application entitled, SURFACE-PASSIVATED MESOPOROUS STRUCTURE SOLAR CELL, invented by Changqing Zhan et al., Ser. No. 14/320,488, filed Jun. 30, 2014. All these applications are incorporated herein by reference.

BACKGROUND OF THE INVENTION

1. Field of the Invention

This invention generally relates to solar cells and, more particularly, to a back contact solar cell using a hybrid organic/inorganic perovskite material.

2. Description of the Related Art

Solar cells based on a combination of organic and inorganic (i.e. organic/inorganic) perovskite materials represent a recent breakthrough in the modern solar cells technology. They have shown a promising power conversion efficiency (PCE) of above 18% in several lab scale cells, using a cost-effective fabrication process and a simple cell structure. In theory, a further improvement of the PCE to 25% is possible, making the perovskite solar cell a desirable technology with a lower cost and higher performance than many other photovoltaic technologies.

FIGS. 1A and 1B are, respectively, mesoporous and planar structure perovskite solar cells (prior art). In general, to achieve appreciable power conversion efficiencies (PCEs) two possible architectures have been adopted for the perovskite materials. The first is a dye-sensitized solar cell (DSC)-style device that comprises: a mesoporous semiconducting metal oxide 106 (e.g., titanium oxide ($TiO_2$)); a perovskite material 108; an organic hole transporting redox material (HIM) 110 to transport positive charges (holes) from the perovskite to the counter electrode; and a gold (Au) or platinum (Pt) counter electrode 112, see FIG. 1A. The planar heterojunction-type device of FIG. 1B has a planar wide band gap n-type semiconductor material 104, such as $TiO_2$, ZnO, etc., on a transparent conductive electrode such as fluorine-doped tin oxide ($SnO_2$:F) (i.e. FTO) or indium tin oxide (ITO), on glass substrate 102, a directly deposited perovskite material 508 on the planar n-type semiconductor 104 as the light absorber layer; an organic HTM 110 on top of the absorber layer 508, and a counter electrode layer 112. $CH_3NH_3PbI_{3-x}Cl_x$ is one example of a perovskite.

Overall, the organic/inorganic perovskite material based solar cell combines the technical merits of both the solid-state dye-sensitized solar cell (ssDSC) and the thin film solar cell (TFSC), and represents the trend of solar cell development in recent years. However, the architecture of a perovskite based solar cell is limited by the use of an organic hole transporting material. Other types of cell architectures, such as the Schotty-type, without a hole-transporting material, result in diminished performance. Besides 2,2',7,7'-tetrakis(N,N-di-p-methoxyphenylamine)-9,9'-spirobifluorene (Spiro-OMe-TAD) as the HTM, several other organic alternatives (P3HT:PSS, for instance) have been suggested. The use of Spiro-OMe-TAD as the hole extraction material provides simplicity in deposition, tolerance to the non-smooth interfaces, and most importantly, it is compatible with the perovskite material, as there are no chemical reactions. However, the use of an organic HTM can significantly restrict the application of this technology due to its relatively low long-term stability and sensitivity to moisture. Thus, a stable inorganic HTM with comparable or better properties than Spiro-OMe-TAD is needed. CuSCN has been reported in the literature as the only inorganic HTM used in a sensitized architecture, yielding about 6% PCE.

An alternative to the conventional cell architecture is presented in parent application Ser. No. 14/320,691, using a wide bandgap p-type semiconductor, such as the oxides of molybdenum, vanadium, tungsten or nickel, as the hole extraction layer (functions as an electron blocking layer) to replace the organic HTM. With a proper p-type wide bandgap oxide semiconductor, this cell structure performs similarly to most thin film solar cell structures, such as ($CuIn_x$ $(Ga_{(1-x)}Se_2)$ (i.e. CIGS) or copper zinc tin sulfide (CZTS). Furthermore, inorganic wide bandgap oxide semiconductors provide better cell stability and moisture resistance, as compared to organic HTM cell. However, such a cell structure still requires the deposition of the selected wide bandgap oxide semiconductor over the perovskite. In many cases, the formation of a metal oxide with the proper crystalline structure requires a high temperature treatment, at which the hybrid perovskite materials are not thermally stable. Thus, perovskite layer applies restrictions in the selection of a p-type semiconductor material, as well as formation method.

It would be advantageous if a hybrid organic/inorganic perovskite solar cell could be fabricated with the advantages of back contacts, and without the disadvantages of using an organic HMI material.

SUMMARY OF THE INVENTION

Disclosed herein is a new cell architecture that takes full advantage of the material properties of hybrid organic/inorganic perovskite. Hybrid organic/inorganic perovskite (i.e. a perovskite comprised of both organic and inorganic materials) performs well as an (optical) absorber material, but also exhibits high carrier mobility. In fact, a mixed iodide/chloride of hybrid perovskite has demonstrated extremely high mobilities for both carriers with a diffusion length approaching about 1 micron. The long carrier diffusion length permits the perovskite solar cell to be enabled in a backside contacting architecture by placing both n- and p-type semiconductors under the absorber (perovskite) layer. Thus, the n- and p-type semiconductors, which respectively function as hole and electron blocking layers, can establish an internal field for charge separation and collection, as long as they are physically close enough, i.e. in the range of the carrier diffusion length for the perovskite. This architecture provides several advantages for further improvement in perovskite solar cell performance and stability. Since the n- and p-type semiconductors can be formed prior to perovskite deposition, any restriction on the selection of semiconductor materials and deposition means is removed. Secondly, there are no significant post perovskite processes. Therefore, the integrity of perovskite remains the same as following its deposition. Thirdly, in such a backside architecture there are no top electrode and metal grids to block incident light and the fill factor is thus improved, resulting in higher photo currents. Overall, a high photo-conversion efficiency results.

Accordingly, a method is provided for forming a back contact perovskite solar cell. The method provides a substrate, and conformally coats the substrate with a positive electrode layer. The positive electrode layer is then conformally coated with a first insulator layer. A plurality of negative electrode segments are selectively deposited overlying the first insulator layer, and a second insulator layer is conformally deposited overlying the negative electrode segments and first insulator layer. The second insulator layer is selectively etched to expose the negative electrode segments, and an n-type semiconductor is selectively deposited overlying each exposed negative electrode segment to form n-type contacts. The first and second insulator layers are then selectively etched. (between the n-type contacts) to expose positive electrode segments. A p-type semiconductor is selectively deposited over each exposed positive electrode segment to form p-type contacts. Finally, a hybrid organic/inorganic perovskite (e.g., $CH_3NH_3PbI_{3-x}Cl_x$) layer is conformally deposited overlying the p-type and n-type contacts.

Some examples of the n-type semiconductor include zinc oxide (ZnO), tin oxide ($SnO_2$), niobium oxide ($Nb_2O_5$), tantalum oxide ($Ta_2O_5$), barium titanate ($BaTiO_3$), strontium titanate ($SrTiO_3$), zinc titanate ($ZnTiO_3$), and copper titanate ($CuTiO_3$), and titanium oxide ($TiO_2$). Some examples of the p-type semiconductor include stoichiometric oxides and non-stoichiometric oxides, such as molybdenum oxide ($MoO_3$), nickel oxide (NiO), vanadium oxide ($V_2O_5$), copper(I), oxide ($Cu_2O$), and tungsten oxide ($WO_3$).

Alternatively, the solar cell can be fabricated by initially coating the substrate with a negative electrode layer, and the deposition of the above-mentioned electrode and doped semiconductor materials is essentially reversed.

Additional details of the above-described methods and a back contact perovskite solar cell are presented below.

BRIEF DESCRIPTION OF THE DRAWINGS

FIG. 3 is a partial cross-sectional view of a first variation of the solar cell of FIG. 2.

FIG. 4 is a partial cross-sectional view of a second variation of the solar cell of FIG. 2.

FIGS. 5A through 5E are cross-sectional views depicting an exemplary fabrication process associated with the solar cell of FIG. 3.

FIG. 6 is a flowchart illustrating a first method for forming a back contact perovskite solar cell.

FIG. 7 is a flowchart illustrating a second method for forming a back contact perovskite solar cell.

DETAILED DESCRIPTION

Figure 1A:
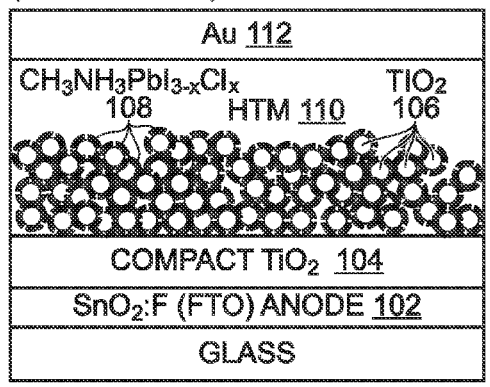
FIGS. 1A and 1B are, respectively, mesoporous and planar structure perovskite solar cells (prior art).
Figure 1B:
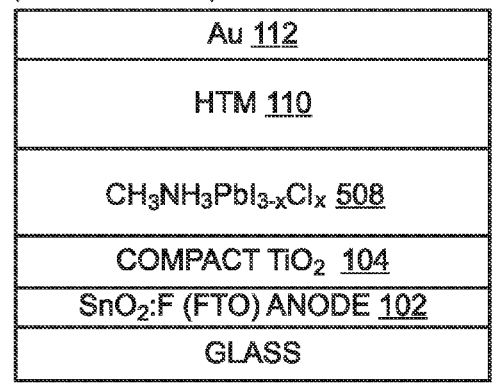
Figure 2:
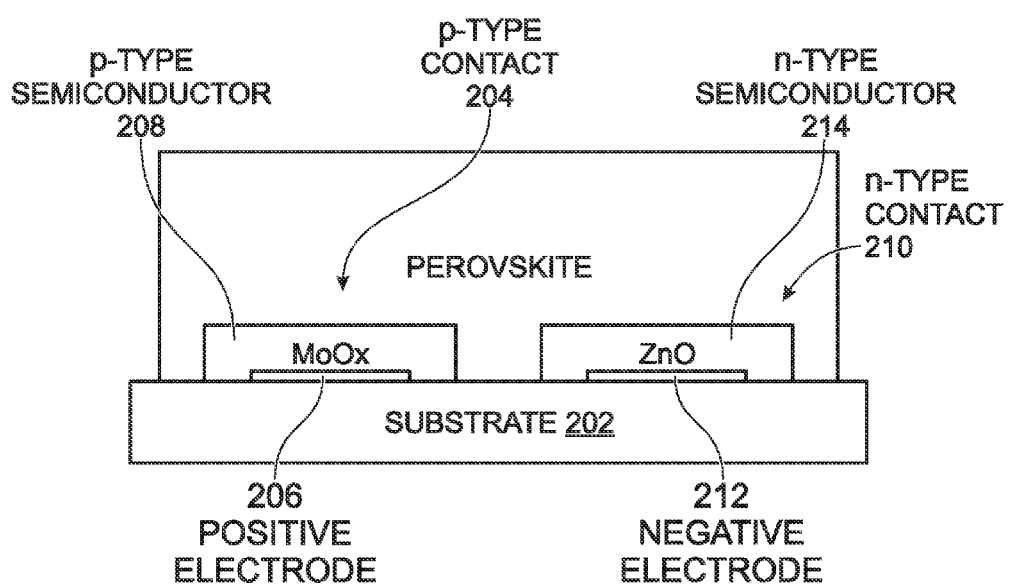
FIG. 2 is a partial cross-sectional view of a back contact perovskite solar cell.

FIG. 2 is a partial cross-sectional view of a back contact perovskite solar cell. The solar cell 200 comprises a substrate 202 with a plurality of p-type contacts 204 overlying the substrate. For simplicity, only one p-type contact 204 is shown. Each p-type contact 204 comprises a positive electrode 206 and a p-type semiconductor segment 208 overlying the positive electrode 206. A plurality of n-type contacts 210 also overlies the substrate 202. Again, for simplicity, only one n-type contact 210 is shown. Each n-type contact 210 comprises a negative electrode 212 and an n-type semiconductor segment 214 overlying the negative electrode. A hybrid organic/inorganic perovskite layer 216 overlies the p-type contacts 204 and n-type contacts 210.

In such a cell 200, the absorption of photons by the hybrid perovskite material 216 is followed by the formation and dissociation of excitons. The separated charges move towards the contact areas, as the nature of the n- and p-type semiconductors 214 and 208 enhances the charge separation. For example, an electron is selectively injected into the n-type semiconductor 214 (e.g., ZnO or $TiO_2$), while the positive charges (holes) are injected into p-type semiconductor 208 (e.g., MoOx NiO, $V_2O_5$ or $WO_3$), where the charges are then extracted.

Some examples of the n-type semiconductor 214 include zinc oxide (ZnO), tin oxide ($SnO_2$), niobium oxide ($Nb_2O_5$), tantalum oxide ($Ta_2O_5$), barium titanate ($BaTiO_3$), strontium titanate ($SrTiO_3$), zinc titanate ($ZnTiO_3$), and copper titanate ($CuTiO_3$), and titanium oxide ($TiO_2$). The p-type semiconductor 208 may be a stoichiometric or non-stoichiometric oxide, some examples of which include molybdenum oxide ($MoO_3$), nickel oxide (NiO), vanadium oxide ($V_2O_5$), copper(I) oxide ($Cu_2O$), and tungsten oxide ($WO_3$). The negative electrode 212 may be Zn, aluminum (Al), or Ti. The positive electrode 206 may be Mo or Ni. Note: this is not an exhaustive list of possible materials.

The hybrid organic/inorganic perovskite layer 216 has the general formula of $ABX_ZY_{3-Z}$;

where "A" is an organic monocation;
where B is a transition metal dication;
where X and Y are inorganic monoanions; and,
where Z is in the range of 0 to 1.5.

In one aspect, the organic monocation "A" is a substituted ammonium cation with the general formula of $R^1R^2R^3R^4N$;

where R is hydrogen, or a compound derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, or combination of above-mentioned elements;

where the dication B is $Pb^{2+}$, $Sn^{2+}$, $Cu^{2+}$, $Ge^{2+}$, $Zn^{2+}$, $Ni^{2+}$, $Fe^{2+}$, $Mn^{2+}$, $Eu^{2+}$, or $Co^{2+}$; and, wherein the monoanions X and Y are independently selected (may be the same or different) from a group including halogenides of F—, Cl—, Br—, and I—, cyanides, and thiocyanides. For example, the hybrid organic/inorganic perovskite 216 may be (iodide/chloride) $CH_3NH_3PbI_{3-x}Cl_x$.

FIG. 3 is a partial cross-sectional view of a first variation of the solar cell of FIG. 2. In this aspect, the positive electrode 206 is a layer conformally coating and in immediate contact with the substrate 202. Each n-type contact 210 negative electrode is a negative electrode segment 212. Each n-type contact 210 further comprises an insulator segment 300 interposed between the positive electrode layer 206 and the negative electrode segment 212. Each n-type contact 210 further comprises insulator sidewalls 302 overlying each insulator segment 300, with the negative electrode segments 212 and the n-type semiconductor segments 214 formed between the insulator sidewalls 302.

FIG. 4 is a partial cross-sectional view of a second variation of the solar cell of FIG. 2. In this aspect, the negative electrode 212 is a layer conformally coating and in immediate contact with the substrate 202. Each p-type contact 206 positive electrode is a positive electrode segment 206. Each p-type contact 206 further comprises an insulator segment 400 interposed between the negative electrode layer 212 and the positive electrode segment 206. Each p-type contact 206 further comprises insulator sidewalls 402 overlying each insulator segment 400. The positive electrode segments 206 and the p-type semiconductor segments 208 are formed between the insulator sidewalls 402.

FIGS. 5A through 5E are cross-sectional views depicting an exemplary fabrication process associated with the solar cell of FIG. 3. In FIG. 5A the positive electrode layer 206 is deposited on substrate 202 followed by a first insulation layer 500. Silicon dioxide is an example of a typical insulation material. In FIG. 5B negative electrode segments 212 are formed over the first insulation layer 500. In one aspect, the negative electrode is conformally deposited and then selectively etched. Photolithography is a commonly used process to permit the selective etching of materials. Following the formation of the negative electrode segments 212, a second insulator layer 502 is formed.

In FIG. 5C the second insulator layer 502 is selectively etched over the negative electrode segments 212, and n-type semiconductor segments 214 are selectively formed over the negative electrode segments 212. Again, these processes can be performed using selective etching with the aid of photolithography. In FIG. 5D the first insulator 500 is selectively etched to expose the positive electrode layer 216 between the n-type contacts 210, resulting in the formation of the p-type contacts 206, insulator segments 300, and insulator sidewalls 302. In FIG. 5E the hybrid organic/inorganic perovskite 216 is deposited to form solar cell 200.

Although not explicitly shown, the fabrication process for the solar cell of FIG. 4 would be essentially the same, with the difference being in the order in which the electrode and semiconductor materials are deposited.

FIG. 6 is a flowchart illustrating a first method for forming a back contact perovskite solar cell. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and is related to the description of FIGS. 5A through 5E. The method starts at Step 600.

Step 602 provides a substrate. For example, the substrate may be an intrinsic semiconductor material such as silicon, or an insulator such as silicon dioxide. Step 604 conformally coats the substrate with a positive electrode layer. Step 606 conformally coats the positive electrode layer with a first insulator layer. Step 608 selectively deposits a plurality of negative electrode segments overlying the first insulator layer. Step 610 conformally deposits a second insulator layer overlying the negative electrode segments and first insulator layer. Step 612 selectively etches the second insulator layer to expose the negative electrode segments. Step 614 selectively deposits an n-type semiconductor overlying each exposed negative electrode segment to form n-type contacts. Step 616 selectively etches the first and second insulator layers to expose positive electrode segments between the n-type contacts. Step 618 selectively deposits a p-type semiconductor overlying each exposed positive electrode segment to form p-type contacts. Step 620 conformally deposits a hybrid organic/inorganic perovskite layer overlying the p-type and n-type contacts. In one aspect, the hybrid organic/inorganic perovskite is $CH_3NH_3PbI_{3-X}Cl_X$. However, as noted above, the perovskite may be selected from a broader range of materials.

The n-type semiconductor may be zinc oxide (ZnO), tin oxide ($SnO_2$), niobium oxide ($Nb_2O_5$), tantalum oxide ($Ta_2O_5$), barium titanate ($BaTiO_3$), strontium titanate ($SrTiO_3$), zinc titanate ($ZnTiO_3$), and copper titanate ($CuTiO_3$), or titanium oxide ($TiO_2$). These oxides may be in a stoichiometric, non-stoichiometric, and doped form. The p-type semiconductor may be stoichiometric oxides or non-stoichiometric oxides, such as molybdenum oxide ($MoO_3$), nickel oxide (NiO), vanadium oxide ($V_2O_5$), copper(I) oxide ($Cu_2O$), and tungsten oxide ($WO_3$). The n- and p-type electrodes may formed from the materials described above, and are not repeated here in the interest of brevity.

FIG. 7 is a flowchart illustrating a second method for forming a back contact perovskite solar cell. The method starts at Step 700. Step 702 provides a substrate, and Step 704 conformally coats the substrate with a negative electrode layer. Step 706 conformally coats the negative electrode layer with a first insulator layer. Step 708 selectively deposits a plurality of positive electrode segments overlying the first insulator layer. Step 710 conformally deposits a second insulator layer overlying the positive electrode segments and first insulator layer. Step 712 selectively etches the second insulator layer to expose the positive electrode segments. Step 714 selectively deposits a p-type semiconductor overlying each exposed positive electrode segment to form p-type contacts. Step 716 selectively etches the first and second insulator layers to expose negative electrode segments between the p-type contacts. Step 718 selectively deposits an n-type semiconductor overlying each exposed negative electrode segment to form n-type contacts. Step 720 conformally deposits a hybrid organic/inorganic perovskite layer overlying the p-type and n-type contacts. The electrode, semiconductor, and perovskite materials may be as described above and are not repeated here in the interest of brevity.

A back contact solar cell using a hybrid organic/inorganic perovskite has been provided, with associated fabrication methods. Examples of particular materials and process steps have been presented to illustrate the invention. However, the invention is not limited to merely these examples. Other variations and embodiments of the invention will occur to those skilled in the art.

We claim:

1. A back contact perovskite solar cell, the solar cell comprising:
   a substrate;
   a plurality of p-type contacts overlying the substrate, each p-type contact comprising:
      a positive electrode;
      a p-type semiconductor segment overlying the positive electrode;
   a plurality of n-type contacts overlying the substrate, each n-type contact comprising:
      a negative electrode;
      an n-type semiconductor segment overlying the negative electrode;
   a hybrid organic/inorganic perovskite layer overlying the p-type and n-type contacts;
   wherein the positive electrode is a layer conformally coating and in immediate contact with the substrate; and,
   wherein each n-type contact negative electrode is a negative electrode segment, and each n-type contact further comprises an insulator segment interposed between the positive electrode layer and the negative electrode segment, and insulator sidewalls overlying each insulator segment, and wherein the negative electrode segments and the n-type semiconductor segments are formed between the insulator sidewalls.

2. The solar cell of claim 1 wherein the n-type semiconductor is selected from a group consisting of zinc oxide (ZnO), tin oxide ($SnO_2$), niobium oxide ($Nb_2O_5$), tantalum oxide ($Ta_2O_5$), barium titanate ($BaTiO_3$), strontium titanate ($SrTiO_3$), zinc titanate ($ZnTiO_3$), and copper titanate ($CuTiO_3$), and titanium oxide ($TiO_2$).

3. The solar cell of claim 1 wherein the p-type semiconductor is selected from a group consisting of stoichiometric and non-stoichiometric oxides.

4. The solar cell of claim 3 wherein the p-type semiconductor is selected from a group consisting of molybdenum oxide ($MoO_3$), nickel oxide (NiO), vanadium oxide ($V_2O_5$), copper(I) oxide ($Cu_2O$), and tungsten oxide ($WO_3$).

5. The solar cell of claim 1 wherein the negative electrode is a material selected from a group consisting of Zn, aluminum (Al), and Ti.

6. The solar cell of claim 1 wherein the positive electrode is a material selected from a group consisting of Mo and Ni.

7. The solar cell of claim 1 wherein the hybrid organic/inorganic perovskite layer has a general formula of $ABX_zY_{3-z}$;
where "A" is an organic monocation;
where B is a transition metal dication;
where X and Y are inorganic monoanions; and,
where z is in a range of 0 to 1.5.

8. The solar cell of claim 7 wherein the organic monocation "A" is a substituted ammonium cation with the general formula of $R^1R^2R^3R^4N$;
where R is selected from a group consisting of hydrogen, and compounds derived from linear alkanes, branched alkanes, cycloalkanes, (poly)cycloalkanes, cis- and trans-linear alkenes, cis- and trans-branched alkenes, linear alkynes, branched alkynes, (poly)alkynes, aromatic hydrocarbons, (poly)aromatic hydrocarbons, heteroarenes, (poly)heteroarenes, thiophenes, (poly)thiophenes, (poly)anilines, and combination of above-mentioned elements;
where the dication B is selected from a group consisting of $Pb^{2+}$, $Sn^{2+}$, $Cu^{2+}$, $Ge^{2+}$, $Zn^{2+}$, $Ni^{2+}$, $Fe^{2+}$, $Eu^{2+}$, $Eu^{2+}$, and $Co^{2+}$; and,
where the monoanions X and Y are independently selected from a group consisting of halogenides of F-, Cl-, Br-, and I-, cyanides, and thiocyanates.

9. The solar cell of claim 1 wherein the hybrid organic/inorganic perovskite is $CH_3NH_3PbI_{3-x}Cl_x$.

10. A back contact perovskite solar cell, the solar cell comprising:
a substrate;
a plurality of p-type contacts overlying the substrate, each p-type contact comprising:
a positive electrode;
a p-type semiconductor segment overlying the positive electrode;
a plurality of n-type contacts overlying the substrate, each n-type contact comprising:
a negative electrode;
an n-type semiconductor segment overlying the negative electrode; and,
a $CH_3NH_3PbI_{3-x}Cl_x$ layer overlying the p-type and n-type contacts.

11. The solar cell of claim 10 wherein the n-type semiconductor is selected from a group consisting of zinc oxide (ZnO), tin oxide ($SnO_2$), niobium oxide ($Nb_2O_5$), tantalum oxide ($Ta_2O_5$), barium titanate ($BaTiO_3$), strontium titanate ($SrTiO_3$), zinc titanate ($ZnTiO_3$), and copper titanate ($CuTiO_3$), and titanium oxide ($TiO_2$).

12. The solar cell of claim 10 wherein the p-type semiconductor is selected from a group consisting of stoichiometric and non-stoichiometric oxides.

13. The solar cell of claim 12 wherein the p-type semiconductor is selected from a group consisting of molybdenum oxide ($MoO_3$), nickel oxide (NiO), vanadium oxide ($V_2O_5$), copper(I) oxide ($Cu_2O$), and tungsten oxide ($WO_3$).

14. The solar cell of claim 10 wherein the negative electrode is a material selected from a group consisting of Zn, aluminum (Al), and Ti.

15. The solar cell of claim 10 wherein the positive electrode is a material selected from a group consisting of Mo and Ni.

16. A back contact perovskite solar cell, the solar cell comprising:
a substrate;
a plurality of p-type contacts overlying the substrate, each p-type contact comprising:
a positive electrode;
a p-type semiconductor segment overlying the positive electrode;
a plurality of n-type contacts overlying the substrate, each n-type contact comprising:
a negative electrode;
an n-type semiconductor segment overlying the negative electrode;
a hybrid organic/inorganic perovskite layer overlying the p-type and n-type contacts;
wherein the negative electrode is a layer conformally coating and in immediate contact with the substrate; and,
wherein each p-type contact positive electrode is a positive electrode segment, and each p-type contact further comprises an insulator segment interposed between the negative electrode layer and the positive electrode segment, and insulator sidewalls overlying each insulator segment, and wherein the positive electrode segments and the p-type semiconductor segments are formed between the insulator sidewalls.

* * * * *

UNITED STATES PATENT AND TRADEMARK OFFICE
CERTIFICATE OF CORRECTION

PATENT NO.         : 9,614,169 B2
APPLICATION NO.    : 14/482450
DATED              : April 4, 2017
INVENTOR(S)        : Alexey Koposov and Wei Pan Page 1 of 1

It is certified that error appears in the above-identified patent and that said Letters Patent is hereby corrected as shown below:

In the Claims

In Column 7, at Line 41, Claim 8, the term "Eu" has been printed twice. The first occurrence of the term should be "Mn".

Signed and Sealed this
Thirtieth Day of May, 2017

Michelle K. Lee
*Director of the United States Patent and Trademark Office*